US008313876B2

(12) United States Patent
Oh et al.

(10) Patent No.: US 8,313,876 B2
(45) Date of Patent: Nov. 20, 2012

(54) EXPOSURE MASK AND METHOD FOR MANUFACTURING SEMICONDUCTOR DEVICE USING THE SAME

(75) Inventors: Soon Ho Oh, Gyeonggi-do (KR); Ki Sung Kwon, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 237 days.

(21) Appl. No.: 12/696,964

(22) Filed: Jan. 29, 2010

(65) Prior Publication Data

US 2010/0136466 A1 Jun. 3, 2010

Related U.S. Application Data

(63) Continuation-in-part of application No. 11/617,658, filed on Dec. 28, 2006, now abandoned.

(30) Foreign Application Priority Data

Jul. 20, 2006 (KR) .................. 10-2006-0067912

(51) Int. Cl.
*G03F 1/00* (2012.01)
*G03F 1/26* (2012.01)

(52) U.S. Cl. ............................. 430/5; 430/311
(58) Field of Classification Search ............... 430/5, 311
See application file for complete search history.

(56) References Cited

U.S. PATENT DOCUMENTS

| 5,212,043 | A |   | 5/1993  | Yamamoto et al. |
| 5,427,876 | A | * | 6/1995  | Miyazaki et al. ............... 430/5 |
| 5,750,680 | A |   | 5/1998  | Kim et al. |
| 5,756,235 | A |   | 5/1998  | Kim |
| 6,051,678 | A |   | 4/2000  | Kim et al. |
| 6,132,926 | A |   | 10/2000 | Jung et al. |
| 6,143,463 | A |   | 11/2000 | Jung et al. |
| 6,150,069 | A |   | 11/2000 | Jung et al. |
| 6,180,316 | B1 |   | 1/2001  | Kajita et al. |
| 6,225,020 | B1 |   | 5/2001  | Jung et al. |
| 6,235,447 | B1 |   | 5/2001  | Lee et al. |
| 6,235,448 | B1 |   | 5/2001  | Lee et al. |
| 2004/0048166 | A1 |   | 3/2004  | Chang |
| 2004/0214096 | A1 | * | 10/2004 | Dulman et al. ............... 430/5 |
| 2005/0147928 | A1 | * | 7/2005  | Frost et al. ............... 430/330 |

FOREIGN PATENT DOCUMENTS

| JP | 04-304452 | 10/1992 |
| JP | 07-261367 | 10/1995 |
| KR | 10-2003-0089343 A | 11/2003 |

OTHER PUBLICATIONS

Kim, J.S., et al., "Implementation of Sub-150 nm Contact Hole Pattern by Resist Flow Process," Jpn. J. Appl. Phys., 37:6863-6868 (Dec. 1998).

* cited by examiner

*Primary Examiner* — Mark F Huff
*Assistant Examiner* — Stewart Fraser
(74) *Attorney, Agent, or Firm* — Kilpatrick Townsend & Stockton LLP

(57) ABSTRACT

A method for manufacturing a semiconductor device comprises forming a photoresist pattern by an exposure process with an exposure mask including a shifter pattern and further performing a reflow process on the photoresist pattern to obtain a line/space pattern having a wave type with a uniform pattern line-width and an improved profile.

11 Claims, 4 Drawing Sheets

(i)

(ii)

(iii)

(iv)

EXPOSURE MASK AND METHOD FOR MANUFACTURING SEMICONDUCTOR DEVICE USING THE SAME

CROSS-REFERENCES TO RELATED APPLICATIONS

The present application is a continuation-in-part of U.S. patent application Ser. No. 11/617,658, filed on Dec. 28, 2006, and which claims priority to Korean patent application number 10-2006-0067912, filed on Jul. 20, 2006, both of which are incorporated by reference in their entirety.

BACKGROUND OF THE INVENTION

The present invention generally relates to an exposure mask and a method for manufacturing a semiconductor device using the same, and more specifically, to a technology of forming a photoresist pattern by an exposure and developing process with an exposure mask including a shifter pattern and further performing a reflow process on the photoresist pattern to obtain a line/space pattern of a wave type with a uniform a pattern line-width and an improved profile.

As semiconductor devices have become smaller recently, the pattern transformation and the Optical Proximity Correction (OPC) process have overcome defects generated by a photo process due to large memory capacity.

BRIEF SUMMARY OF THE INVENTION

Various embodiments of the present invention are directed at providing an exposure mask and a method for manufacturing a semiconductor device using the same which comprises forming a photoresist pattern by an exposure and developing process with an exposure mask including a shifter pattern and further performing a reflow process on the photoresist pattern.

According to an embodiment of the present invention, an exposure mask for fabricating a semiconductor device comprises a substrate, and first and second island type shifter patterns. The substrate includes a transparent pattern, a first opaque pattern, a second opaque pattern neighboring the first opaque pattern and a third opaque pattern neighboring the second opaque pattern. The first island type shifter pattern is formed overlapping with the transparent pattern. The second island type shifter pattern is formed between the second opaque pattern and the third opaque pattern, and overlapping with the transparent pattern. The first island type shifter pattern and the second island type shifter pattern are arranged diagonally. The opaque patterns are formed of chromium (Cr). The shifter patterns are formed of molybdenum silicon (MoSi). The opaque patterns are each a line/space pattern of a straight type. In one embodiment of the present invention, the shifter patterns are straight, circular, lozenge-shaped (i.e., diamond-shaped), or square.

According to an embodiment of the present invention, a method for manufacturing a semiconductor device comprises: forming a photoresist film over a semiconductor substrate; performing an exposure process with the above-described exposure mask to form a line/space of wave type photoresist pattern; and performing a reflow process on the photoresist pattern. The photoresist film includes a base resin with one or more repeating units selected from the group consisting of vinyl phenol, poly hydroxyl styrene, polynorbonene, poly imide, polyacrylate, polymeta acrylate and combinations thereof. The reflow process is performed at a temperature ranging from about 80° C. to about 250° C. The reflow process is performed for about 5 seconds to about 100 seconds.

DETAILED DESCRIPTION OF THE SPECIFIC EMBODIMENT

The present invention will be described in detail with reference to the accompanying drawings.

Figure 1:
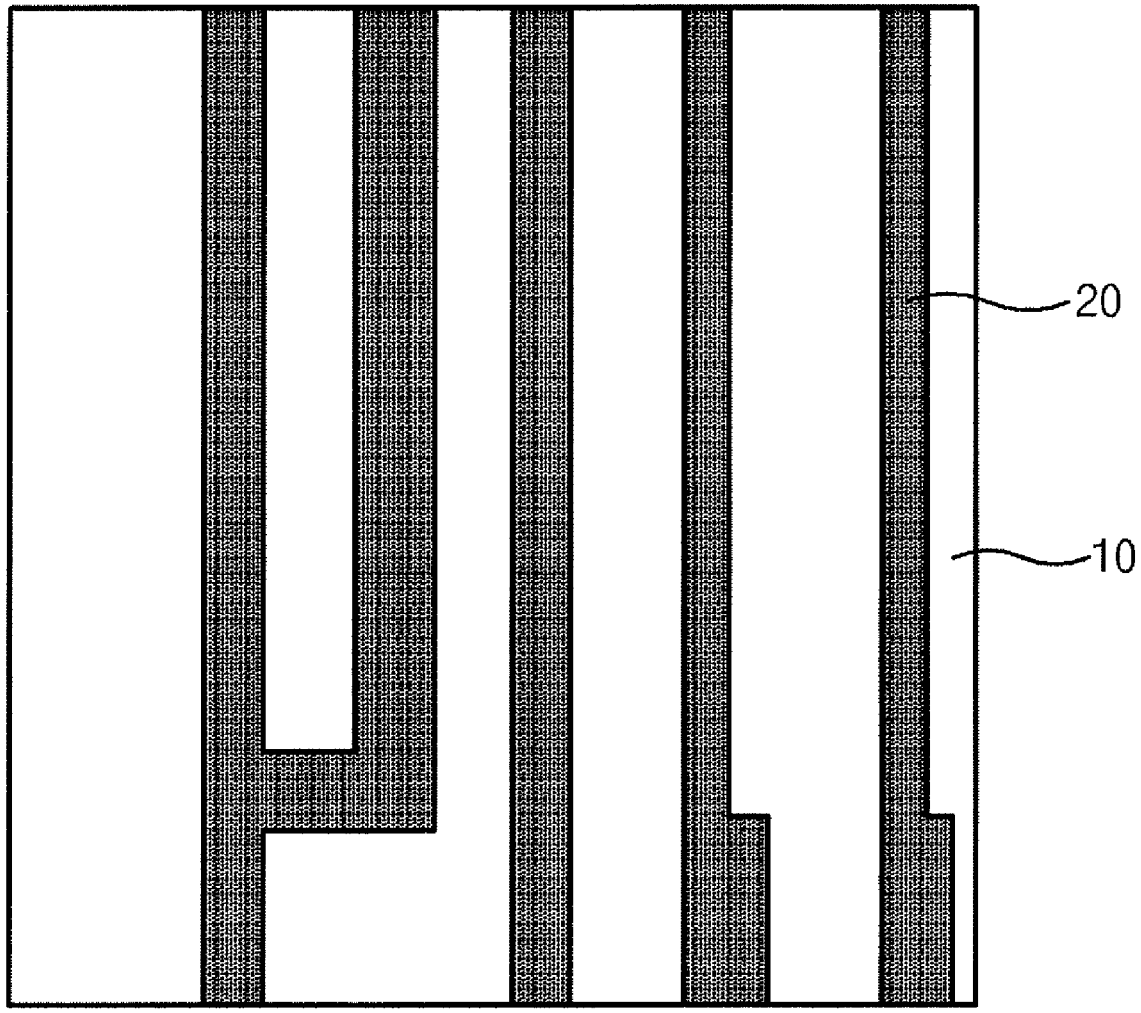
FIG. 1 is a layout illustrating a conventional exposure mask.

FIG. 1 is a layout illustrating a conventional exposure mask. The exposure mask comprises a transparent pattern 10 and an opaque pattern 20 that is a line/space pattern 20 of a straight type.

When the line/space pattern is formed with the exposure mask, the formation process requires a change in consideration of operation factors of devices. Although the exposure mask including the line/space pattern has excellent characteristics, it is difficult to change the exposure mask by the OPC process. As a result, the process margin is reduced.

Figure 2:
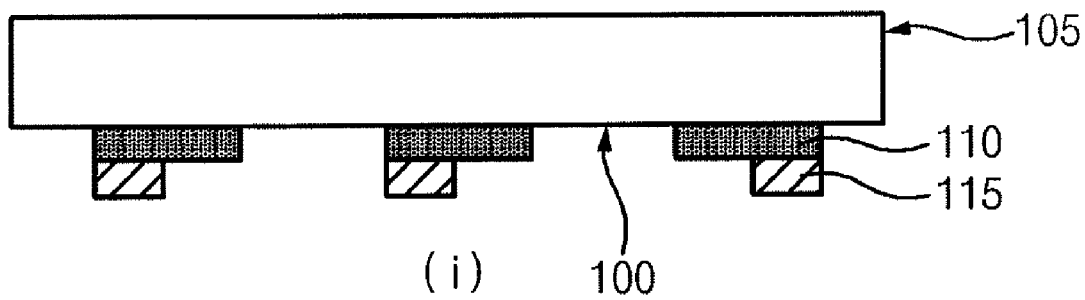
FIG. 2 is a cross-sectional diagram illustrating an exposure mask of a semiconductor device according to an embodiment of the present invention.
Figure 2:
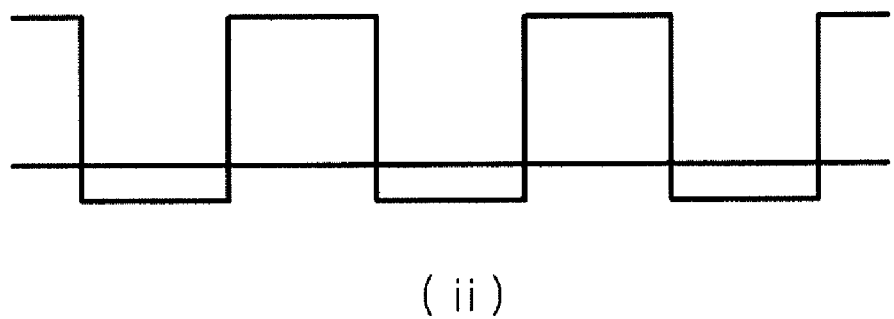
Figure 2:
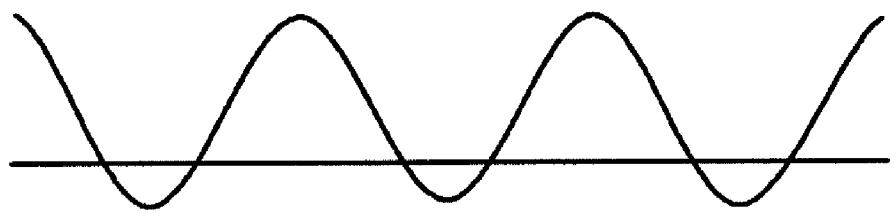
Figure 2:
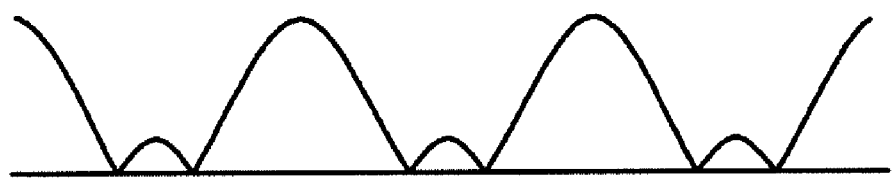

FIG. 2 is a cross-sectional diagram illustrating an exposure mask for a semiconductor device according to an embodiment of the present invention. The exposure mask comprises a shifter pattern 115 formed over a substrate 105 including a transparent pattern 100 and an opaque pattern 110.

The opaque pattern 110, which is formed of chromium (Cr), is a line/space pattern of a straight type. The shifter pattern 115, which is formed of molybdenum silicon (MoSi), is formed in a region where a pattern having a larger line-width than the designed line-width or a line/space pattern of a wave type is formed. In some embodiments, the shifter pattern 115 is formed over the opaque pattern 110. The shifter pattern 115, however, may be overlapped with the transparent pattern 100.

FIG. 2(ii) shows an electric field over the exposure mask passed through structure FIG. 2(i). FIG. 2(iii) shows an electric field over a wafer. FIG. 2(iv) shows the intensity of the electric field over the wafer.

A light source energy of the region where the shifter pattern 115 is formed is different from that of the region where the shifter pattern 115 is not formed. The shifter pattern 115 is selectively positioned on the exposure mask 105, so that the light source energy corresponding to the shifter pattern 115 is applied to a photoresist film formed over the wafer.

As a result, different parts of the photoresist film are developed to different degrees during the developing process. The photoresist film is converted to a photoresist pattern having a line/space pattern of a wave type.

A pattern having a large line-width or a line/space pattern of a wave type is formed by an energy difference of the light sources passed through the region where the shifter pattern 115 is formed and through the region where the shifter pattern 115 is not formed.

Figure 3A:
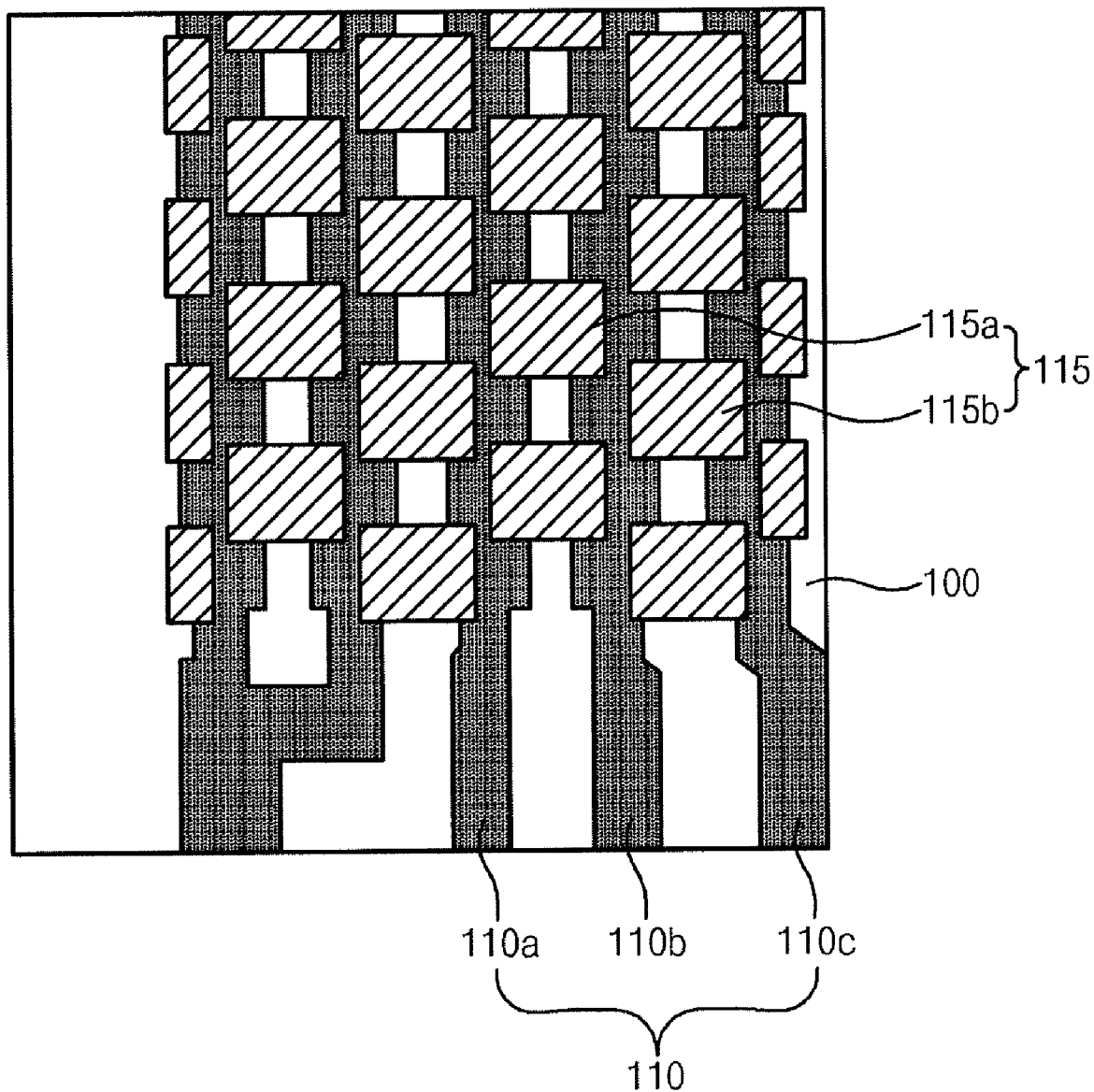
FIGS. 3a through 3c are diagrams illustrating a method for manufacturing a semiconductor device using the exposure mask according to an embodiment of the present invention.
Figure 3B:
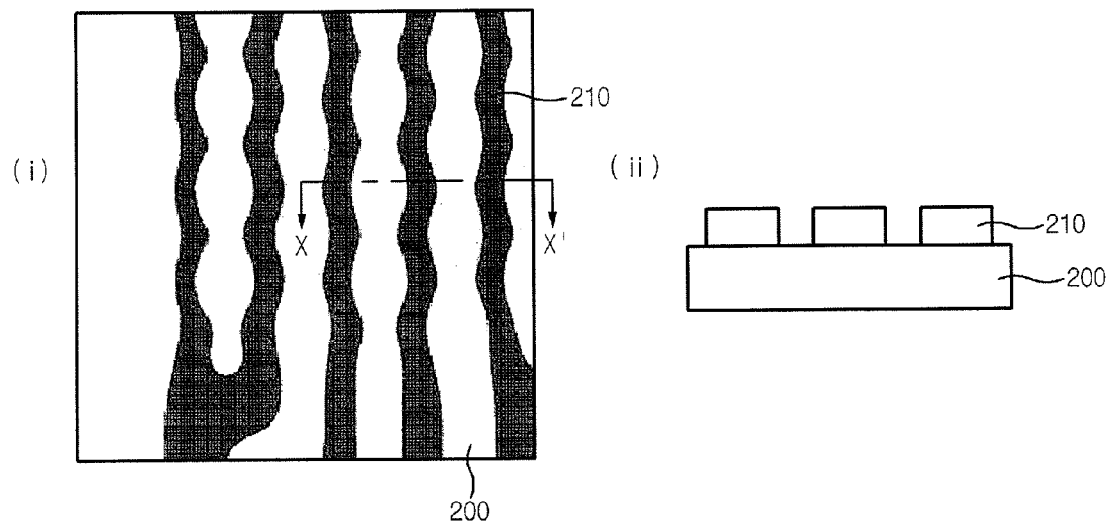
Figure 3C:
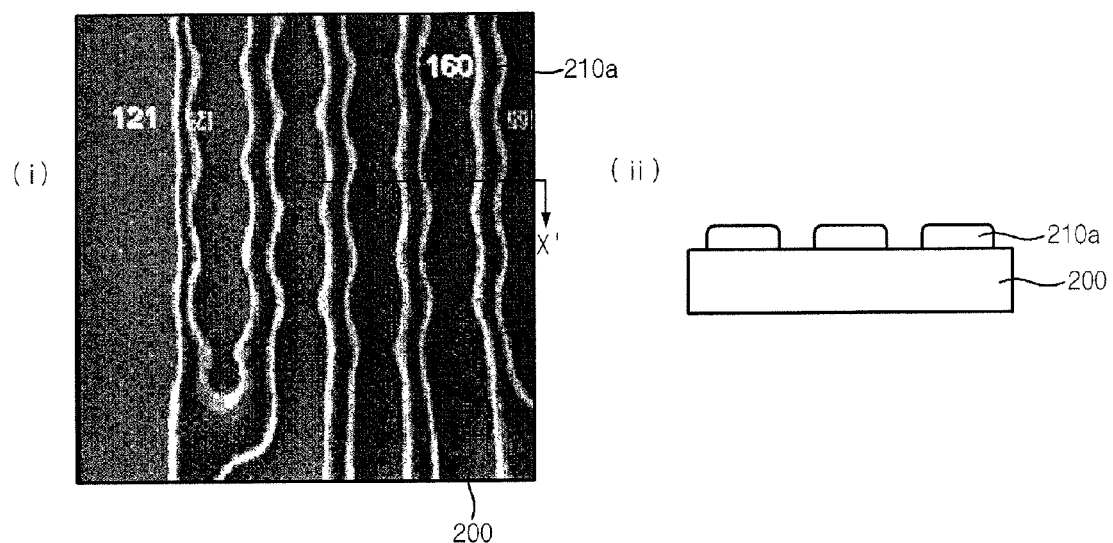

FIGS. 3a through 3c are diagrams illustrating a method for manufacturing a semiconductor device using the exposure mask of FIG. 2 according to an embodiment of the present invention.

FIG. 3a shows the bottom of the exposure mask comprising a first shifter pattern 115a and a second shifter pattern 115b extending over the transparent pattern 100, a first opaque pattern 110a, a second opaque pattern 110b and a third opaque pattern 110c. The first opaque pattern 110a is formed neighboring the second opaque pattern 110b, and the second opaque pattern 110b is formed neighboring the third opaque pattern 110c. The first opaque pattern 110a, the second opaque pattern 110b and the third opaque pattern 110c, which are formed of chromium (Cr), may be a line/space pattern of a straight type or a contact hole pattern.

The first shifter pattern 115a and the second shifter pattern 115b are formed of molybdenum silicon (MoSi). The first shifter pattern 115a and the second shifter pattern 115b are formed where a line-width of the pattern is formed to be larger or where a line/space pattern of a wave type is formed.

In one embodiment of the present invention, the first shifter pattern 115a and the second shifter pattern 115b are island-type patterns. In some embodiments, the first shifter pattern 115a and the second shifter pattern 115b are formed to be straight, circular, lozenge-shaped (i.e., diamond-shaped), square, or other shapes according to the application.

FIG. 3b shows a simulation image of the pattern after the exposure process with the exposure mask of FIG. 3a and the reflow process. FIG. 3c shows the pattern formed over the substrate after the reflow process is performed at approximately 135° C. for approximately 95 seconds.

FIG. 3b and FIG. 3c are diagrams illustrating according to the method for manufacturing a semiconductor device using the exposure mask of FIG. 3a accordance with an embodiment of the present invention, FIGS. 3b and 3c show a method for manufacturing a semiconductor device with an exposure mask of FIG. 3a, wherein (i) is a plane diagram and (ii) is a cross-sectional diagram taken along X-X' of (i).

A photoresist film (not shown) is formed over a semiconductor substrate 200.

An exposure process is performed using the exposure mask of FIG. 3a to form a pattern having a larger line-width than that of the designed pattern or the first photoresist pattern 210 which is a line/space pattern of a wave type.

In some embodiments, the exposure process is performed with a light source selected from the group consisting of i-line, KrF, ArF, EUV, E-Beam, and X-ray.

In the present embodiment, the photoresist film comprising a base resin with one or more repeating unit selected from the group consisting of vinyl phenol, poly hydroxyl styrene, polynorbonene, poly amide, poly imide, polyacrylate, polymethacrylate and combination thereof. Such a photoresist film has been disclosed in U.S. Pat. No. 5,212,043, U.S. Pat. No. 5,750,680, U.S. Pat. No. 6,051,678, U.S. Pat. No. 6,132,926, U.S. Pat. No. 6,143,463, U.S. Pat. No. 6,150,069, U.S. Pat. No. 6,180,316 B1, U.S. Pat. No. 6,225,020 B1, U.S. Pat. No. 6,235,448 B1, and U.S. Pat. No. 6,235,447 B1, which are incorporated by reference.

A reflow process is performed on the first photoresist pattern 210 to form a second photoresist pattern 210a. The reflow process is performed to remove the residual solvent in a developing process for forming the first photoresist pattern 210.

The reflow process has been disclosed in Japanese Journal of Applied Physics (Vol. 37 (1998) pp. 6863-6868) The reflow process is performed at a glass transition temperature in the present embodiment, e.g., at a temperature ranging from about 80° C. to about 1650° C., more preferably from about 250° C. to about 600° C. The reflow process is performed in an oven for about 5 seconds to about 100 seconds in the present embodiment.

After the exposure process, a line/space pattern of a large wave type is formed by a chemical reaction difference between the region where the first shifter pattern 115a or the second shifter pattern 115b is provided and the region where the first shifter pattern 115a or the second shifter pattern 115b is not provided, during the reflow process of the first photoresist pattern 210.

As described above, in a method for manufacturing a semiconductor device according to an embodiment of the present invention, a shifter pattern is formed on an exposure mask comprising a opaque pattern which is a line/space pattern of a straight type so that a line/space pattern of a wave type or a pattern of a large line-width is formed to reduce the number of exposure used.

The above embodiments of the present invention are illustrative and not limitative. Various alternatives and equivalents are possible. The invention is not limited by the lithography steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. An exposure mask for fabricating a semiconductor device, the mask comprising:
    a substrate including an first opaque pattern, a second opaque pattern neighboring the first opaque pattern, a third opaque pattern neighboring the second opaque pattern, a first transparent pattern between the first opaque pattern and the second opaque pattern, and a second transparent pattern between the second opaque pattern and the third the opaque pattern;
    a first island type shifter formed over the first transparent pattern, the first opaque pattern, and the second opaque pattern, wherein the width of the first island type shifter is larger than that of the first transparent pattern; and
    a second island type shifter formed over the second transparent pattern, the second opaque pattern, and the third opaque pattern, wherein the width of the second island type shifter is larger than that of the second transparent pattern.

2. The exposure mask according to claim 1, wherein the first opaque pattern, the second opaque pattern and the third opaque pattern are a line/space pattern of a straight type.

3. The exposure mask of claim 2, wherein the first shifter and the second shifter are arranged diagonally.

4. The exposure mask according to claim 1, wherein the first opaque pattern, the second opaque pattern and the third opaque pattern are formed of chromium (Cr).

5. The exposure mask according to claim 1, wherein the first shifter and the second shifter are formed of molybdenum silicon (MoSi).

6. The exposure mask according to claim 1, wherein the first shifter and the second shifter are straight, circular, lozenge-shaped, or square.

7. A method for manufacturing a semiconductor device, the method comprising:
    forming a photoresist film over a semiconductor substrate;
    performing an exposure process with an exposure mask of claim 1 to form a line/space of wave type photoresist pattern; and
    performing a reflow process on the photoresist pattern.

8. The method according to claim 7, wherein the photoresist film comprising a base resin with one or more repeating unit selected from the group consisting of vinyl phenol, poly hydroxyl styrene, polynorbonene, poly amide, poly imide, polyacrylate, polymethacrylate, and combination thereof.

9. The method according to claim 7, wherein the reflow process is performed at a temperature ranging from about 80° C. to about 1650° C.

10. The method according to claim 7, wherein the reflow process is performed at a temperature ranging from about 250° C. to about 600° C.

11. The method according to claim 7, wherein the reflow process is performed for about 5 seconds to about 100 seconds.

* * * * *